(12) United States Patent
Barnes et al.

(10) Patent No.: US 6,552,575 B2
(45) Date of Patent: Apr. 22, 2003

(54) WORD LINE TESTABILITY IMPROVEMENT

(75) Inventors: William Barnes, Bristol (GB); Paul Hammond, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/942,092

(22) Filed: Aug. 29, 2001

(65) Prior Publication Data

US 2002/0145450 A1 Oct. 10, 2002

(30) Foreign Application Priority Data

Aug. 31, 2000 (GB) .............................. 0021437

(51) Int. Cl.⁷ ................................ G11C 8/00
(52) U.S. Cl. .................... 326/105; 326/106; 326/16
(58) Field of Search .................. 326/105–108, 326/16; 365/201, 230.06

(56) References Cited

U.S. PATENT DOCUMENTS 5,432,744 A * 7/1995 Nagata ...................... 365/201
5,544,123 A * 8/1996 Hoshi et al. ............ 365/230.06
5,719,879 A    2/1998 Gillis et al.
5,923,601 A    7/1999 Wendell
5,936,892 A    8/1999 Wendell

OTHER PUBLICATIONS

Standard Search Report from United Kingdom application No. 0021437.9, filed Aug. 31, 2000.
European Search Report from corresponding European patent application No. 01 30 7194.

* cited by examiner

Primary Examiner—Michael Tokar
Assistant Examiner—Anh Q Tran
(74) Attorney, Agent, or Firm—Wolf, Greenfield & Sacks, P.C.; James H. Morris

(57) ABSTRACT

The present invention proposes a method of disabling a particular decoder output during scan-mode testing without impacting the critical path during either scan-mode or the normal mode of operation. During scan-mode testing a known bit stream may be programmed into latches and provides a means of functional testing the device in question. Three embodiments are used in conjunction with a disable driver to pull an intermediate node HIGH. The intermediate node is inverted by an output driver, which disables the relevant decoder output. The first embodiment involves using a full CMOS gate, the second embodiment uses ratio logic and the third uses a weak pull-up resistor.

12 Claims, 6 Drawing Sheets

WORD LINE TESTABILITY IMPROVEMENT

FIELD OF THE INVENTION

The invention relates to decoding circuitry for addressing a memory circuit having a scan latch arrangement.

BACKGROUND OF THE INVENTION

Computer and dedicated hardware circuits use RAM (Random Access Memory) to allow quick retrieval of stored data. This data may either be instructions forming part of a computer program or alternatively operand data to be manipulated. The data is stored in memory cells. For example, a typical SRAM memory consists of an array of memory cells having bit lines and word lines. A decoder circuit receives a binary address thereby selecting the relevant bit line and word line so that the appropriate memory cell can be read from or written to.

Many modern integrated circuits have scan latches connected to the inputs and outputs. The integrated circuit can be in a scan mode of operation whereby a known bit stream is loaded into each latch of a scan latch arrangement and then at a predetermined time, the latches may be clocked onto the inputs to the integrated circuit. In this manner, a technical person is able to efficiently perform certain tests on such a circuit.

Furthermore, in many decoder memory circuits there is an enable signal that is used to synchronise the non-inverting inputs with the inverting inputs, because an inverted signal passes through an inverting element and experiences a certain delay. The enable signal is used to only enable the decoder circuitry once both inputs have settled.

A requirement, for example on an SRAM circuit, is to disable the decoder circuitry during scan mode operation thus preventing multiple word lines from being activated, which corrupts memory cells. A known solution is to gate a scan mode signal with an enable signal so that the decoder is not enabled during scan mode and only enabled during the normal mode of operation when the enable signal is present. The problem is that the gate element introduces an additional unwanted delay period into the critical path of the decoding circuitry.

Therefore one of the aims of the preferred embodiments of the present invention is to prevent the decoder from activating word lines during scan-mode operation without introducing an unwanted delay into the critical path.

A distinction needs to be made between the delay purposefully introduced so as to synchronise the inverting and non-inverting inputs and the unwanted delay that occurs as a result of the gating arrangement inherent to the standard solution of disabling the decoder outputs during scan-mode operation.

SUMMARY OF THE INVENTION

According to one aspect of the invention there is provided a decoder for activating one of a plurality of output lines depending on a binary address received on a plurality of input lines each providing a respective inverted and non-inverted input which are synchronised by a decode signal, the decoder having a plurality of identical circuits each for driving one of said output lines, each circuit comprising: a plurality of serially connected switching elements between a first node and a second node, each switching element receiving an input from at least one of said respective inverted or non inverted input lines; pull-up means for pulling said first node to a high potential; an output driver connecting said first node to said output line; and a disable driver for driving said second node to a low or a high potential depending on the decoder's mode of operation.

Preferably, each of the respective inverting inputs has an inverting element with a propagation delay and where a decode signal enables the decoder at intervals of said propagation delay thereby synchronising the received inverted and non-inverted inputs.

Preferably, wherein each input of the decoder circuit has a scan-latch and these are arranged in a chain to receive a known bit stream scanned through the latches during a scan mode of operation. Preferably, in the scan mode of operation the second node potential is driven high by the disable driver and when all the switching elements are switched on, said high potential is supplied to the first node where pull-up means prevent drops in potential across the switching elements from pulling the first node potential low. Preferably, wherein the output driver inverts the high potential on the first node thereby disabling the selected output line.

Preferably, wherein the pull-up means of the decoder circuit is used to connect the first node to a positive voltage supply. A first embodiment of the pull-up means comprises a full CMOS gate having a plurality of PMOS transistors, each transistor having the gate terminal connected to an input line. A second embodiment of the pull-up means comprises a PMOS transistor having its gate terminal connected to earth. A third embodiment of the pull-up means comprises a resistor.

According to another aspect of the present invention there is provided a method for operating a decoder for activating one of a plurality of output lines depending on a binary address received on a plurality of input lines each having an inverted and a non-inverted input which are synchronised by a decode signal, the decoder having a plurality of identical circuits each for driving one of said output lines, wherein the method for operating each circuit comprises: applying said respective inverted or non inverted inputs to a plurality of serially connected stacked switching elements between a first node and a second node; pulling said first node to a high potential using pull-up means; driving said output line with an output driver connected to said first node; and driving said second node to a high or low potential with a disable driver depending on the decoder's mode of operation.

BRIEF DESCRIPTION OF THE DRAWINGS

The present invention will now be described by way of an example with reference to the accompanying drawings, in which.

DESCRIPTION OF THE PREFERRED EMBODIMENT

Figure 1:
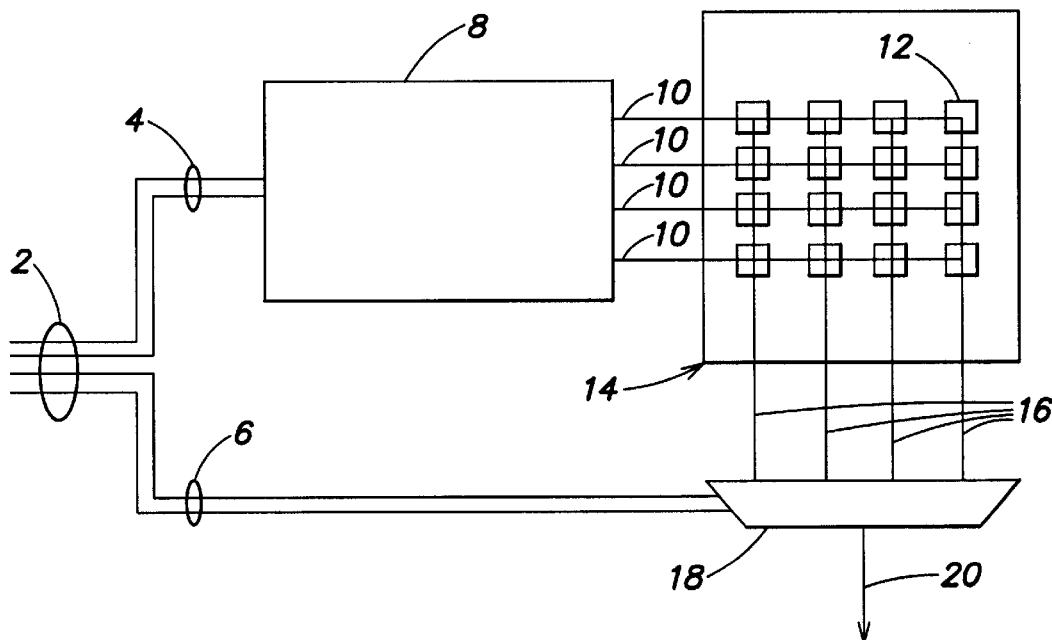
FIG. 1 shows a four-bit SRAM memory addressing circuit.

An example of a typical SRAM (Static Random Access Memory) memory is shown in FIG. 1. The structure shows an array 14 of memory cells 12, where each cell holds a certain state either a "1" or a "0". Memory addressing circuitry is required so that a particular cell in the array can be accessed. A binary address, consisting of a certain number of bits 2, is fed to the addressing circuitry. A portion of these bits 4 identifies the desired word line 10, while the remaining bits 6 select the correct bit line 16.

In the example, the first two bits 4 are inputs to a decoder 8, which selects the desired output or word line 10. The activated word line causes all the memory cells 12 in that row to be driven HIGH. The remaining bits 6 control a multiplexer 18 in selecting a relevant bit line 16. The addressing scheme produces an output 20, which is the value stored in the addressed memory cell in the array.

The output from the decoder circuit must only activate one word line 10 at any given time. If more than one word line is active and a particular bit line has been selected, the wrong memory cell could be accessed resulting in memory corruption.

Figure 2:
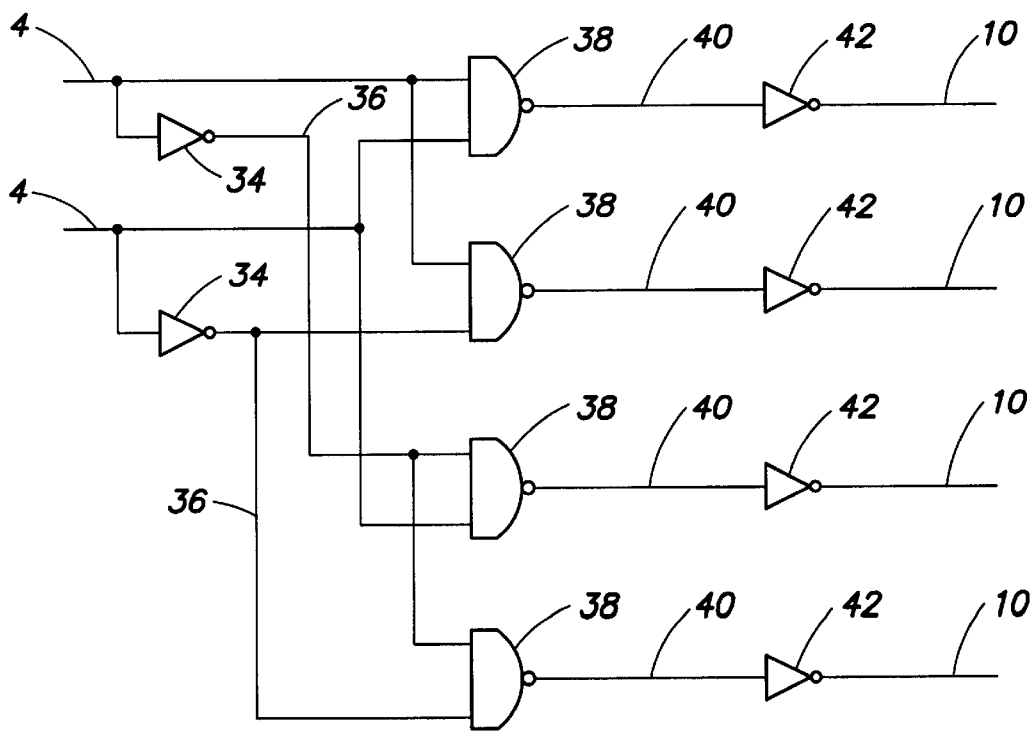
FIG. 2 shows an example of the how the decoder may be implemented.

Therefore, a requirement of the decoder architecture is that only one of the outputs (i.e. word lines) is activated for a particular address. To meet this requirement, FIG. 2 is an example of a simple decoder architecture that may be effected. The decoder assumes a two-bit input as shown in FIG. 1, which uses four NAND gates 38 and two groups of inverters 34,42 to select the desired word line 10. The first group of inverters 34 are used to invert the two input bits 4. The inverted bits 36 along with the non-inverted bits 4 constitute the four possible input configurations to each NAND gate 38. A truth table of a NAND gate and the results of the four possible configurations are shown below in Table 1.

TABLE 1

| A | B | NAND |
|---|---|------|
| 0 | 0 | 1 |
| 0 | 1 | 1 |
| 1 | 0 | 1 |
| 1 | 1 | 0 |

Only one of the configurations, i.e. where both inputs are HIGH, produces a LOW output from the NAND gate. The three remaining NAND gates all produce a HIGH output. The second group of inverters 42 is then able to invert the NAND outputs 40. This results in only the selected word line 10 being driven HIGH (i.e. activated), while the remaining word lines are LOW.

Although the example of FIG. 2 uses four NAND gates, it will be evident to a man skilled in the art that this is a non-limiting example and in practice the circuitry is understandably far more complex due to the large number of memory cells that might be expected to be accessed. A more complex decoder circuit may be implemented using various decode levels or stages composed of different logic gates.

Figure 3:
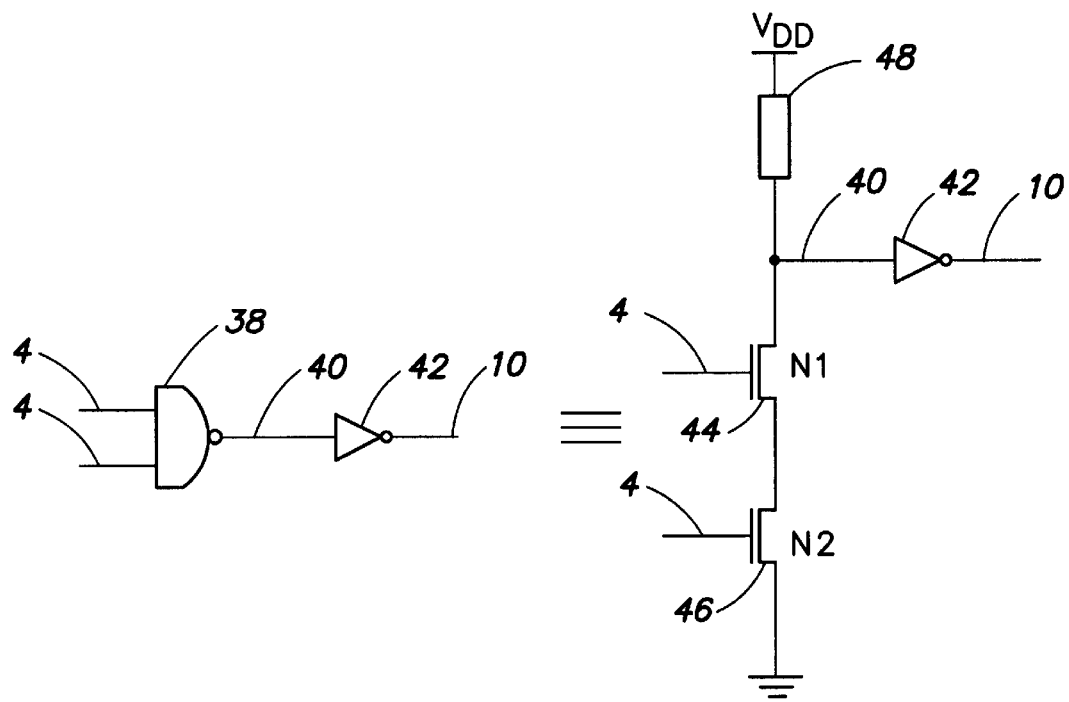
FIG. 3 shows the MOSFET equivalent circuit of a two-input NAND gate.

FIG. 3 is an example of an equivalent circuit using NMOS transistors to effect the desired characteristics of a NAND gate. The gate 38 having two inputs 4 represents any of the four NAND gates shown in the example of FIG. 2. The equivalent circuit shows that the two inputs are connected to the respective gates of two NMOS transistors 44, 46. An NMOS transistor is only turned ON when the gate is HIGH. Therefore, if either of the two inputs is LOW and the corresponding transistor is OFF, then the input 40 to the inverter 42 is pulled HIGH by the source voltage $V_{dd}$. This state is inverted 42 and the output 10 will be LOW as expected. Alternatively, if both of the gates of the NMOS transistors are HIGH then both transistors are turned ON resulting in a voltage divider circuit where a resistor 48 is chosen to be substantially larger than the volt drops across each NMOS transistor 44, 46. Therefore, the large volt drop across the resistor 48 results in a LOW input to the inverter 42. The output of the inverter produces a HIGH state and the word line 10 is activated as expected.

Figure 4:
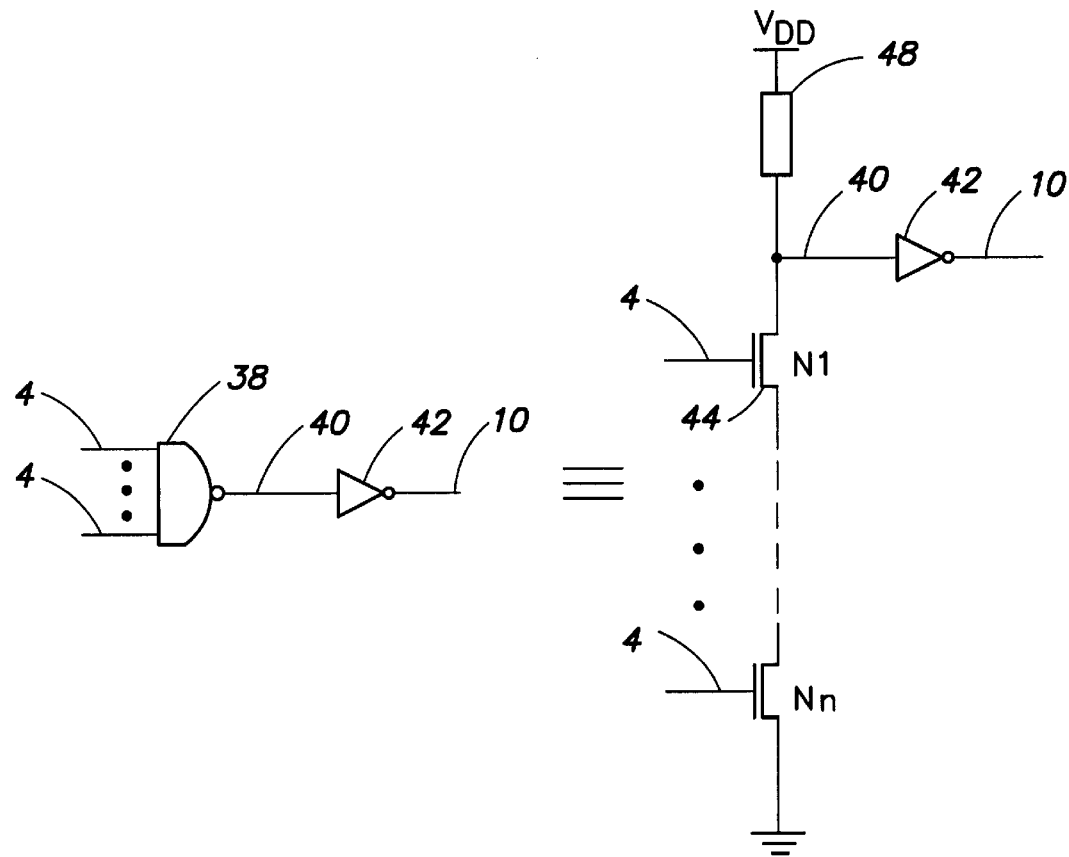
FIG. 4 shows the MOSFET equivalent circuit of an n-input NAND gate.

FIG. 4 shows the general case where in a different and possibly more complex decoder architecture there may be more than two inputs to a NAND gate. The equivalent NMOS circuit shows that the number of transistors needed (i.e. $N_1 \ldots N_n$) corresponds to the number of inputs to the NAND gate. It is also evident from the equivalent circuit, that only one of the NMOS transistors needs to be OFF for the resulting word line 10 to be driven LOW.

Figure 5:
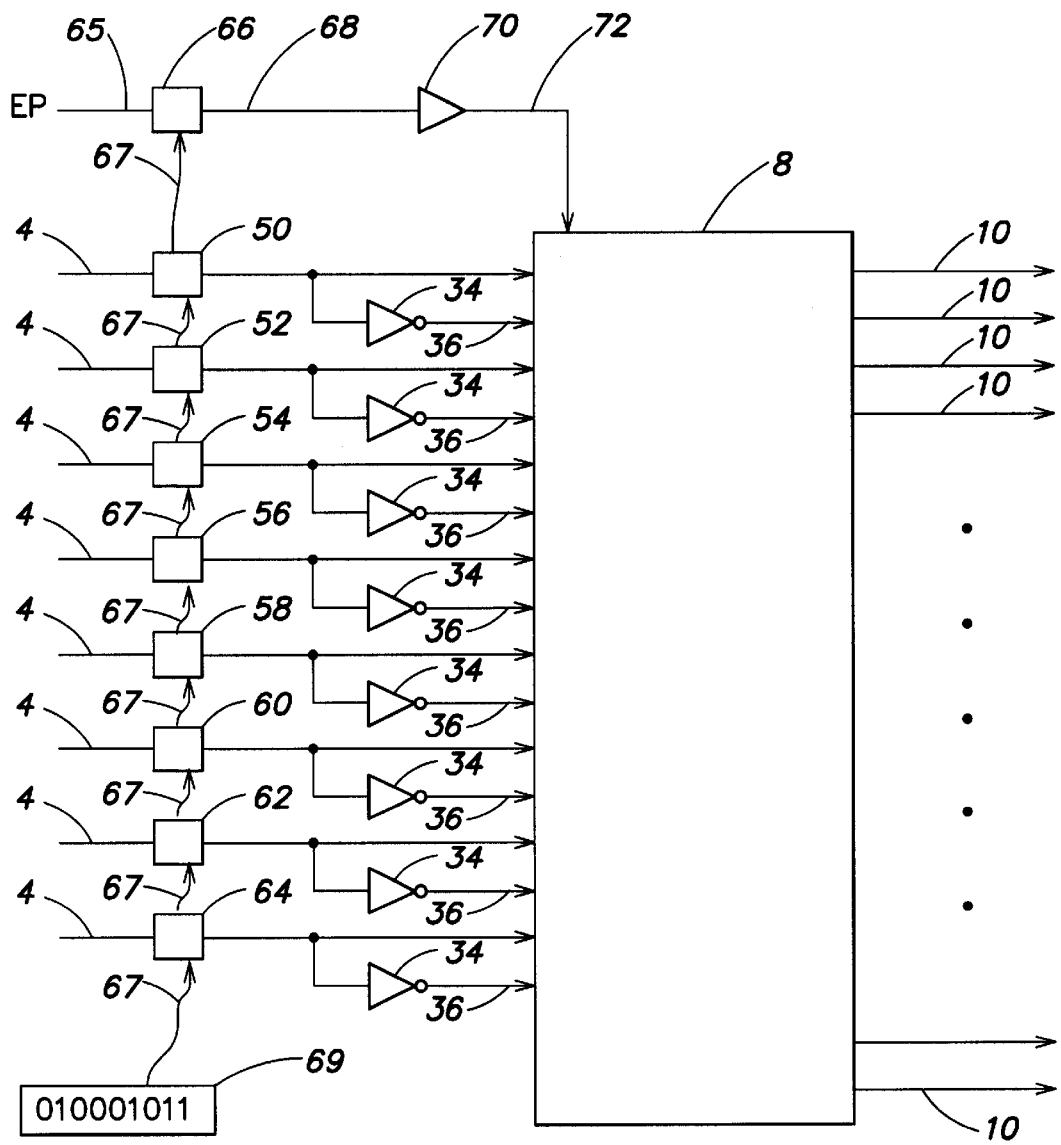
FIG. 5 shows an eight-input decoder with an Enable Predecode signal and a scan-mode latching arrangement.

FIG. 5 shows a more complex eight-bit input 4 to a decoder. It also serves to illustrate two other aspects that need to be considered in such a circuit. Firstly, a set of latches 50, 52, 54, 56, 58, 60, 62, 64, 66 is shown, which store certain programmed values during scan-mode operation. Secondly, an Enable Predecode 65 signal is illustrated.

Scan-Mode Operation

Most modern IC devices require test points or access nodes where it is possible to verify that a manufactured device coming off an assembly line is indeed functioning as it should. Similarly, the test points are useful during repair of a faulty chip and provide a method of trouble-shooting the problem by reducing the list of possibilities. Scan-mode testing is based on these principles and facilitates functional testing of such devices. A set of latches 50, 52, 54, 56, 58, 60, 52, 64, 66 is used to store a specific value required on each input 4 to the decoder. This is accomplished by serially programming a desired bit stream 69 into the latches and then, at a predefined instant, the required binary states are clocked out onto their relevant input lines 4. A more detailed description of the various stages during scan-mode operation is:

1. The system clock is stopped, i.e. the inputs to the decoder are 'frozen'.

2. A known bit stream is pulsed into the latches in a successive order. Thus, a scan-mode 'pulse' signal will load the first bit of the stream 69 into the first latch 64. The next pulse transfers 67 the value stored in the first latch 64 into the next latch 62, while simultaneously loading 67 the next bit in the stream into the first latch 64. The process is continued until the desired bit stream 69 is loaded into the latches.

3. The next stage is to enable the system clock (unfreeze) and the desired test bit stream 69 is clocked out of the latches providing the inputs 4 to the decoder 8.

A circuit designer or technician expects certain outputs from the programmed bit stream. It is then a simple matter of measuring these outputs or test points to validate the correct functioning of the circuit.

Enable Predecode

Figure 6:
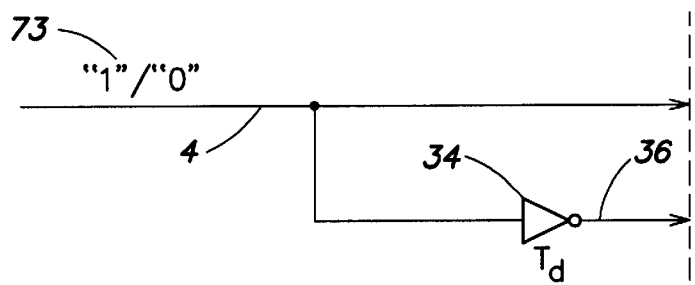
FIG. 6 shows an enlarged view of an inverting and non-inverting input.

FIG. 5 also shows an Enable Predecode 65 signal, which acts as a control signal to the decoder 8. Each input 4 to the decoder 8 consists of an inverted 36 and non-inverted input 4. The Enable Predecode signal is used to account for the delay that arises as a result of the first group of inverters 34 producing the inverted inputs. FIG. 6 shows an enlarged view of one of the eight inputs to the decoder. A problem arises when the input 4 is 'toggled' 73, i.e. there is a change of state. For example, if the input 4 is a '1', the inverter 34 produces the required inverted input signal 36, i.e. a '0'. However, the input signal experiences a delay $T_d$ when it passes through the inverter 34, while the non-inverting input is fed directly to the decoder. Therefore, these inputs need to be synchronised. If the inputs are not synchronised and the input 4 is toggled for a second time, the inverting input retains the previous value (i.e. '0') for a certain time period $T_d$. However, in this time period the non-inverting input adopts the most recent 'toggled' state value, i.e. a '0'. Thus, for a short time $T_d$, both the inverting and non-inverting inputs have the same value. This is an invalid state and as such results in multiple word lines 10 being activated and possible memory corruption. To overcome this an Enable Predecode 65 signal is used having a time delay modelled as a delay element 70, which only enables 72 the decoder when the inverting input has settled. The magnitude of the delay 70 would be equivalent to that expected to result from the inverter elements 34, i.e. $T_d$.

Figure 7:
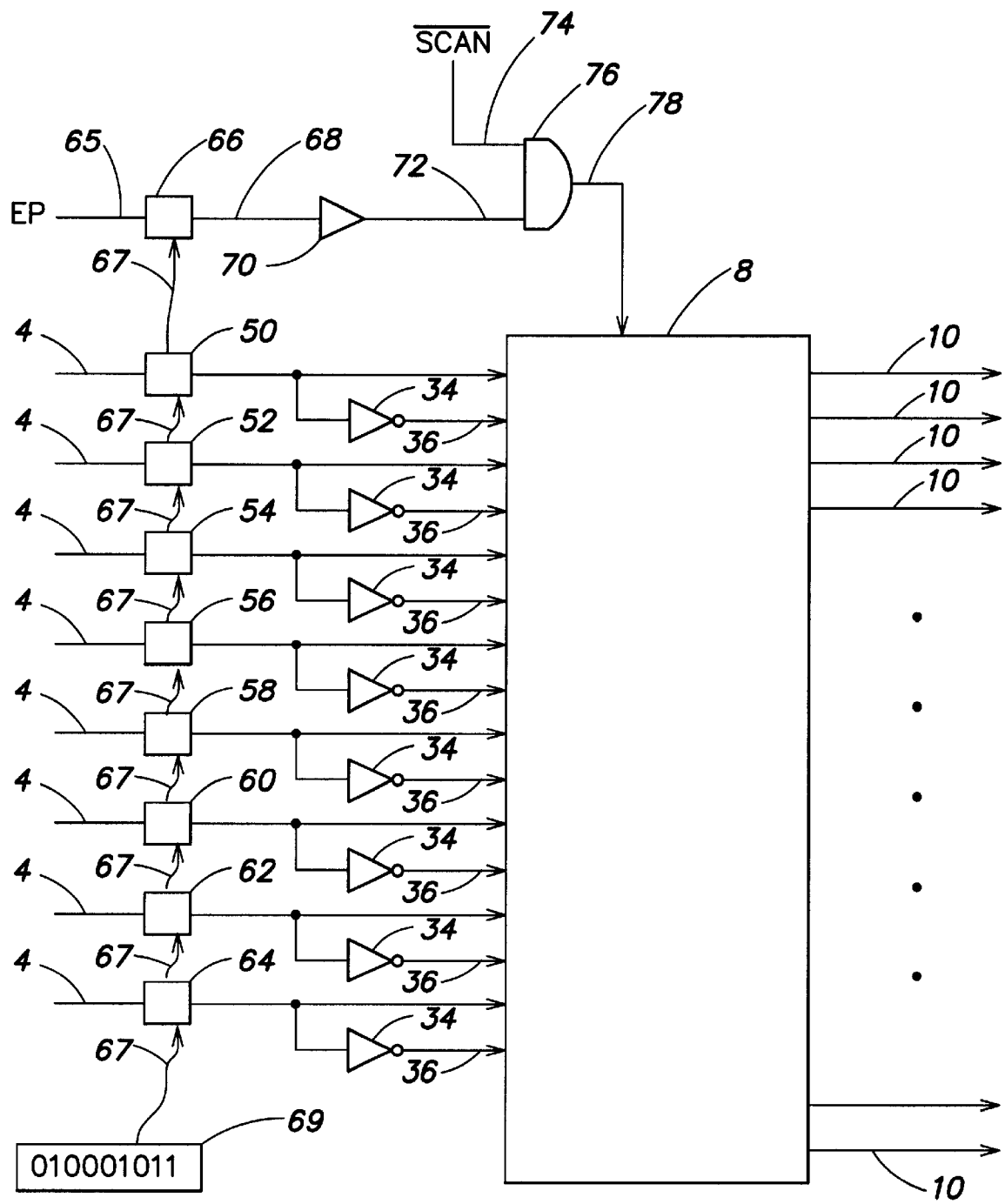
FIG. 7 shows an eight-input decoder and a known solution using a gating arrangement with a scan-mode input.

The problem is to try and prevent the decoder from activating word lines during scan-mode operation. A standard solution involves gating the inputs with a disable signal. In FIG. 7, an AND gate 76 accepts an Enable Predecode signal 65 and a 'not-in-scan-mode' signal 74, which is equivalent to gating each input 4 with a disable signal. Therefore, the decoder 8 will only be enabled when the result 78 of the AND gate is HIGH. The problem with the standard solution is that the gating arrangement introduces a further unwanted delay into the critical path, even during the normal mode of operation.

Figure 8:
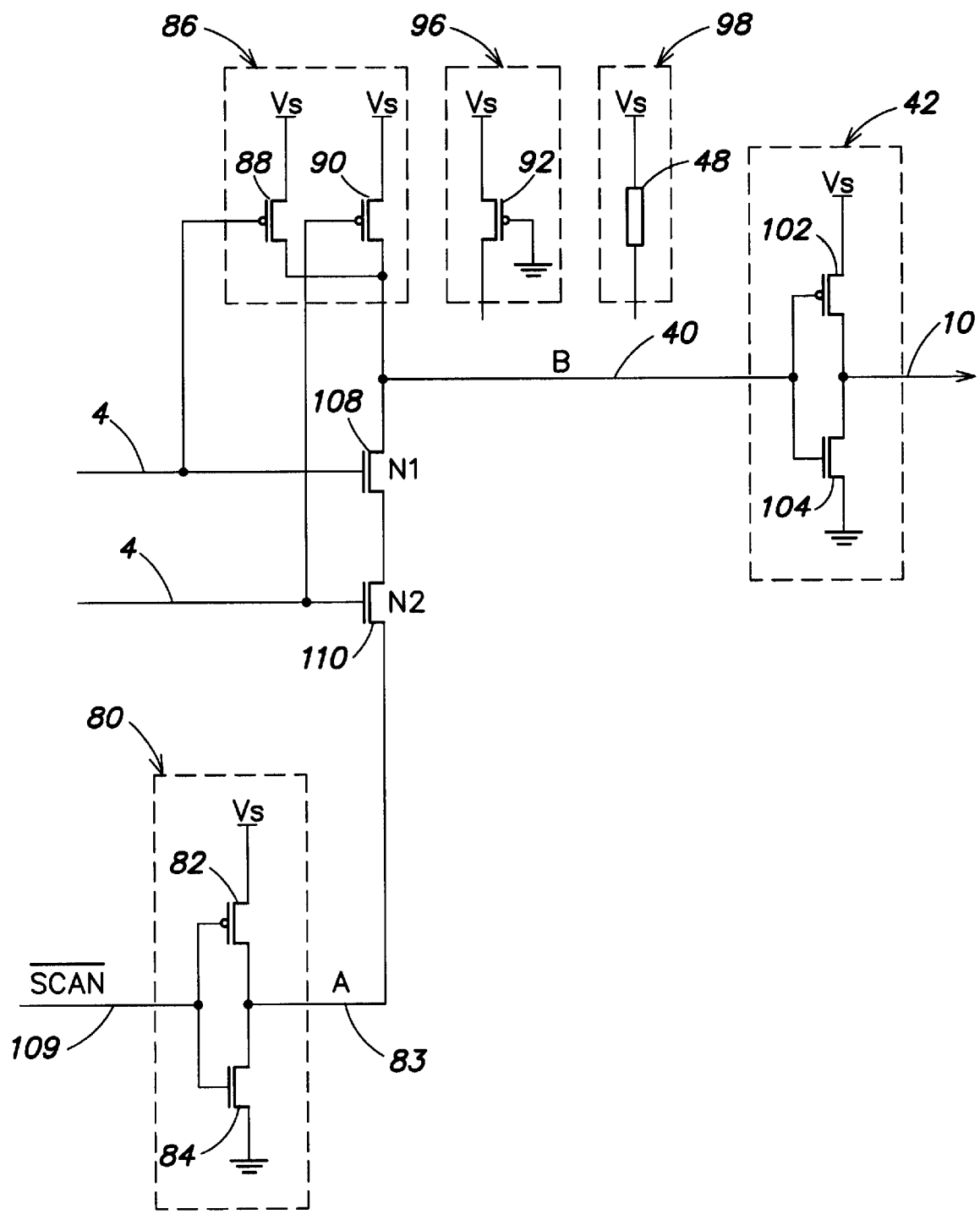
FIG. 8 shows how the present invention may be carried into effect using the disable driver.

FIG. 8 shows the present invention using a simplified decoder circuit having only two inputs. The principle is to disable the decoder output or word line 10 by holding node B 40 HIGH. During scan-mode operation it is a requirement to disable a certain decoder output 10 thus preventing the activation of multiple word lines. The present description provides three embodiments of how this may be carried into effect.

The output driver is shown as a CMOS inverter 42. The driver consists of a NMOS transistor 104 and a PMOS transistor 102. If node B 40 is HIGH, the NMOS transistor 104 is turned ON, while the PMOS transistor 102 is OFF. Therefore, the word line 10 is pulled LOW (i.e. disabled). If node B is LOW, the opposite occurs where the PMOS transistor 102 is turned ON pulling the word line 10 HIGH. The output driver 42 therefore inverts the state on the intermediate node B 40.

It should be realised that while the present invention can be used during both operation modes, the main objective is to hold node B HIGH during scan mode testing. Three embodiments are proposed for holding the node B 40 HIGH to disable the decoder output 10. Each embodiment is described by analysing the circuit's operation during a i) scan-mode and a ii) normal mode of operation. In scan-mode operation, the input 109 to the disable driver 80 will be LOW, thereby turning ON the PMOS transistor 82 and turning OFF the NMOS transistor 84, thereby pulling node A 83 HIGH. In the normal mode of operation, the input 109 to the disable driver 80 will be HIGH (i.e., not in scan-mode), thereby turning OFF the PMOS transistor 82 and turning ON the NMOS transistor 84, thereby pulling node A 83 LOW. Furthermore, for each mode of operation one needs to consider two cases:

a) when the inputs 4 are all HIGH and the word line is expected to be selected and b) when one of the inputs 4 is LOW and the word line is not expected to be selected.

The first embodiment consists of a full CMOS gate 86, where the inputs 4 are connected to the gates of PMOS transistors 88, 90 as well as to the NMOS transistors 108, 110 that form part of the NAND gate.

i) Scan-mode a) Node A 83 is pulled HIGH and the inputs 4 are all HIGH, which means the NMOS transistors are all turned ON and a connection is made between node A 83 and node B 40. Although the PMOS transistors are all off, node A pulls node B HIGH. The CMOS inverter 42 then pulls the output 10 LOW, thereby disabling the word line.

b) Node A 83 is pulled HIGH. If one of the inputs 4 is LOW, the corresponding NMOS transistor will be turned OFF. Thus there is no connection between node A and B and the disable driver has no effect. However, the PMOS transistor corresponding to the LOW input 4 will be ON. The PMOS transistors are connected in parallel to a supply voltage $V_{dd}$. Therefore, the corresponding PMOS transistor is turned ON and node B 40 is pulled HIGH. Node B is inverted resulting in the decoder output 10 being disabled.

ii) Normal Mode a) Node A 83 is pulled LOW and is connected to node B 40, which is inverted and the decoder output is activated (i.e. HIGH).

b) Node A 83 is pulled LOW, but is disconnected from node B 40. Node B is pulled HIGH by the PMOS transistor that has been turned ON as a result of the relevant LOW input 4. Node B is inverted and the decoder output is disabled.

The second embodiment consists of a single weak PMOS transistor 92 that is used in ratio logic 96. The PMOS transistor has a gate that is connected to ground and is thus permanently turned ON. The PMOS transistor 92 is sized to produce a larger volt drop than across the series volt drops across the switching terminals of the other NMOS transistors 108, 110 that have been turned ON. The resulting voltage divider is such that most of the voltage is dropped across the PMOS transistor 92 and as such node B can be considered to be LOW when node A is LOW.

i) Scan-mode a) Node A 83 is pulled HIGH and there is a connection between node A and node B 40. Node B is already pulled weakly HIGH by the transistor and is pulled strongly HIGH by Node A. The CMOS inverter drives the output low and the word line is disabled.

b) Node A 83 is pulled HIGH, but there is no connection between node A and node B 40. Therefore, node B is pulled HIGH by the PMOS transistor, which means that the CMOS inverter drives the output low and the word line is disabled.

ii) Normal Mode a) Node A 83 is pulled LOW and there is a connection between node A and node B 40. The effect of the voltage divider means that node B is taken to be LOW and the inverter activates the decoder output.

b) Node A 83 is pulled LOW, but there is no connection between node A and node B 40. Therefore, node B is pulled HIGH by the PMOS transistor, which means that the CMOS inverter drives the output low and the word line is disabled.

The third embodiment shows a pull-up resistor 48 and is sized as in the second embodiment to produce a larger volt drop than across the other NMOS transistors that have been turned ON. Similarly, the resulting voltage divider is such that most of the voltage is dropped across the resistor and as such node B can be considered to be LOW when NODE A is LOW.

The various modes of operation for the third embodiment are exactly the same as for the second embodiment and need no further explanation.

The analysis of the various modes of operation confirms the results that would be expected from the output driver of the decoder. Thus, in any of the three embodiments the output 10 of the decoder 8 is disabled during scan-mode operation. None of these embodiments impact on the critical path of the decoder.

Figure 9:
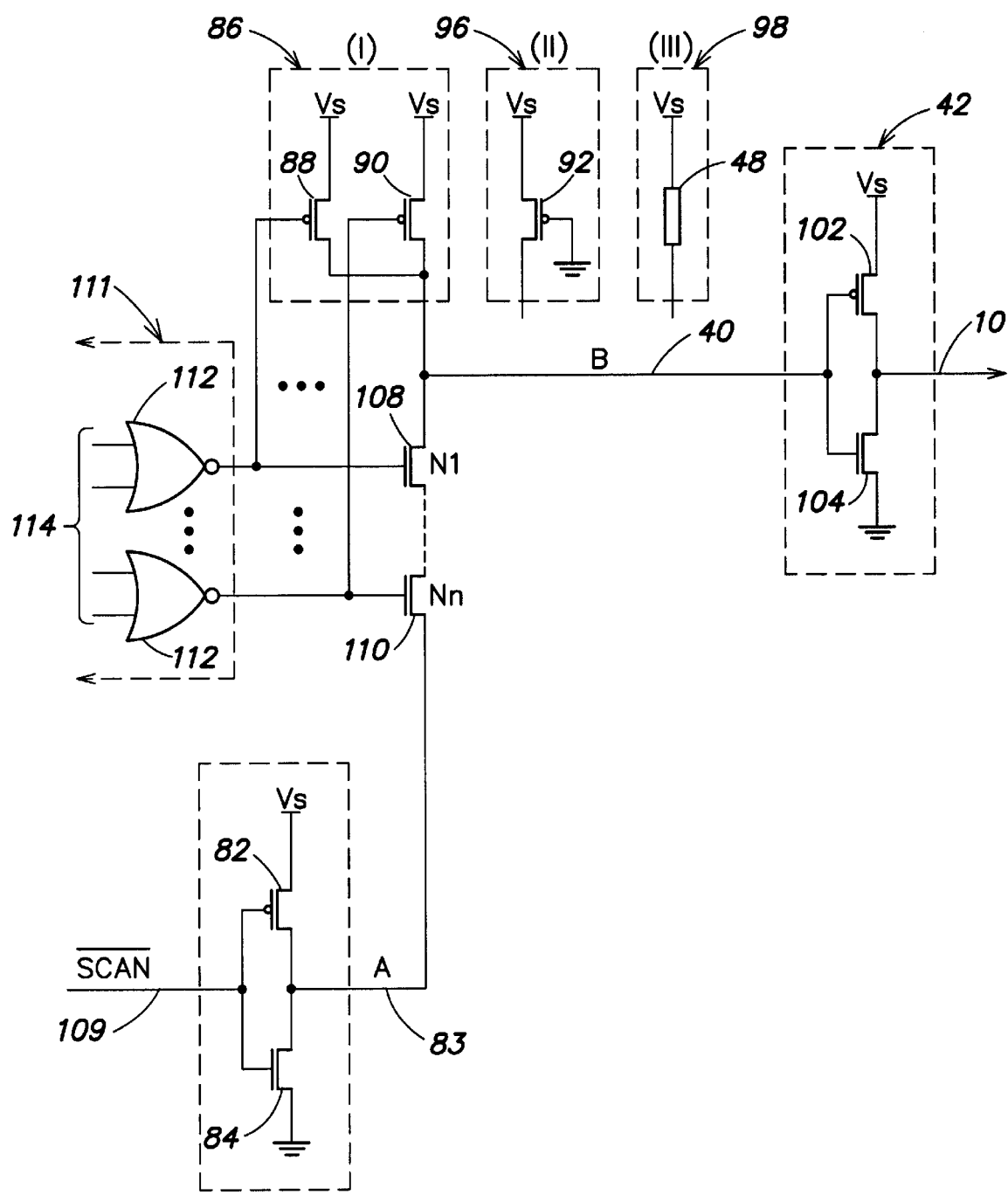
FIG. 9 shows how the present invention may be used for a general decoder arrangement containing multiple inputs.

FIG. 9 shows how the present invention may be used for the general case, where a decoder has many inputs, that is more than two inputs as presented in the circuit of FIG. 8. The present invention is not limited to a particular decoder architecture 111 and it may be composed of a hierarchy of cascaded decode levels 114, each consisting of a unique logical gate 112 arrangement. More generally, it should be realised that in practice the decoder architecture 8 would consist of many identical circuits similar to the circuits shown in FIGS. 8 or 9. So for the simple two-input NAND gate decoder example of FIG. 4, the present invention will be effected by using the circuit of FIG. 8 for each NAND gate. Therefore, this decoder architecture will be implemented using the four identical circuits, each as shown in FIG. 8.

It should be understood that the circuit components used in this description are intended to be non-limiting. More generally, it would be appreciated by a man skilled in the art that the MOSFET's might be replaced by other switching means, for example JFET's or bipolar transistors. It should also be realised that the three different embodiments relating to the pull-up means of the present invention are examples and there may be other circuits or methods for doing this.

What is claimed is:

1. A decoder for activating one of a plurality of output lines depending on a binary address received on a plurality of input lines each providing a respective inverted and non-inverted input which are synchronised by a decode signal, the decoder having a plurality of identical circuits each for driving one of said output lines, each circuit comprising:

a plurality of serially connected switching elements between a first node and a second node, each switching element receiving an input from at least one of said respective inverted or non-inverted input lines;

pull-up means for pulling said first node to a high potential;

an output driver connecting said first node to said output line; and a disable driver for driving said second node to a low or a high potential depending on the decoder's mode of operation.

2. A decoder circuit according to claim 1, wherein each input line has a scan-latch which are arranged in a chain to receive a known bit stream scanned through the latches during a scan mode of operation.

3. A decoder circuit according to claim 1, wherein each of said respective inverting inputs has an inverting element with a propagation delay and where a decode signal enables the decoder at intervals of said propagation delay thereby synchronising the received inverted and non-inverted inputs.

4. A decoder circuit according to claim 1, wherein in the scan mode of operation the second node potential is driven high by the disable driver and when all the switching elements are switched on, said high potential is supplied to the first node where pull-up means prevent drops in potential across the switching elements from pulling the first node potential low.

5. A decoder circuit according to claim 4, wherein the high potential on the first node is inverted by the output driver thereby de-activating said output line by driving it low.

6. A decoder circuit according to claim 1, wherein the pull-up means is used to connect the first node to a positive voltage supply.

7. A decoder circuit according to claim 6, wherein the pull-up means comprises a full CMOS gate having a plurality of PMOS transistors, each transistor having the gate terminal connected to an input line.

8. A decoder circuit according to claim 6, wherein the pull-up means comprises a PMOS transistor having its gate terminal connected to earth.

9. A decoder circuit according to claim 6, wherein the pull-up means comprises a resistor.

10. A decoder circuit according to claim 1, wherein the switching element is a NMOS transistor.

11. A decoder circuit according to claim 1, wherein the disable driver and the output driver are CMOS inverter circuits.

12. A method for operating a decoder for activating one of a plurality of output lines depending on a binary address received on a plurality of input lines each having an inverted and a non-inverted input which are synchronised by a decode signal, the decoder having a plurality of identical circuits each for driving one of said output lines, wherein the method for operating each circuit comprises:

applying said respective inverted or non-inverted inputs to a plurality of serially connected stacked switching elements between a first node and a second node;

pulling said first node to a high potential using pull-up means;

driving said output line with an output driver connected to said first node; and driving said second node to a high or low potential with a disable driver depending on the decoder's mode of operation.

* * * * *